United States Patent
Da Dalt

(10) Patent No.: US 7,772,929 B2
(45) Date of Patent: Aug. 10, 2010

(54) DEVICE AND METHOD FOR FREQUENCY SYNTHESIS

(75) Inventor: Nicola Da Dalt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1 day.

(21) Appl. No.: 10/541,049

(22) PCT Filed: Jan. 27, 2004

(86) PCT No.: PCT/EP2004/000677

§ 371 (c)(1),
(2), (4) Date: Feb. 13, 2006

(87) PCT Pub. No.: WO2004/068697

PCT Pub. Date: Aug. 12, 2004

(65) Prior Publication Data

US 2006/0158260 A1    Jul. 20, 2006

(30) Foreign Application Priority Data

Jan. 29, 2003    (DE) ................ 103 03 405

(51) Int. Cl.
*H03L 7/099*    (2006.01)
(52) U.S. Cl. ............ 331/16; 331/57; 331/117 R; 331/179
(58) Field of Classification Search .......... 331/16, 331/57, 117 R, 179
See application file for complete search history.

(56) References Cited

U.S. PATENT DOCUMENTS

| | | | |
|---|---|---|---|
| 4,555,793 A * | 11/1985 | Benamy ............ 377/48 |
| 4,633,183 A * | 12/1986 | Heatherington ........ 327/107 |
| 4,658,406 A | 4/1987 | Pappas |
| 5,781,459 A | 7/1998 | Bienz |
| 5,825,253 A | 10/1998 | Mathe et al. |
| 6,429,799 B1 * | 8/2002 | Kamas et al. .......... 341/155 |
| 6,556,088 B1 * | 4/2003 | Dietl et al. ............ 331/17 |
| 6,734,741 B2 * | 5/2004 | Staszewski et al. ..... 331/36 C |
| 2001/0050598 A1 | 12/2001 | Mourant et al. |
| 2002/0158696 A1 | 10/2002 | Staszewski et al. |

FOREIGN PATENT DOCUMENTS

| | | |
|---|---|---|
| DE | 28 33 653 | 2/1979 |
| DE | 195 46 928 | 6/1997 |
| DE | 199 25 742 | 12/2000 |
| EP | 0 430 493 | 6/1991 |
| GB | 2 002 157 | 2/1979 |

OTHER PUBLICATIONS

PCT International Search Report for International Application No. PCT/EP2004/000677 mailed Jul. 21, 2004 (3 pages).

* cited by examiner

*Primary Examiner*—Robert Pascal
*Assistant Examiner*—Levi Gannon
(74) *Attorney, Agent, or Firm*—Dicke, Billig & Czaja, PLLC

(57) ABSTRACT

A method and a device are proposed for frequency synthesis by means of oscillator means, particularly a digitally controlled oscillator, which are capable of generating output frequencies out of a set of possible output frequencies. For the purpose of generating a desired frequency that is not included in the set of possible output frequencies, the oscillator means are driven by a control device in such a way that said oscillator means alternately generate at least two different output frequencies, out of the set of possible output frequencies, in such a way that the average value of the generated output frequencies over a time period is substantially the desired frequency.

9 Claims, 6 Drawing Sheets

(PRIOR ART) FIG 1
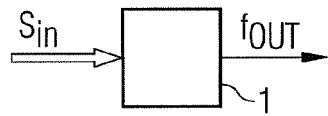
FIG 2
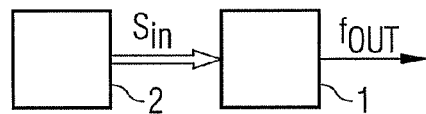
FIG 3
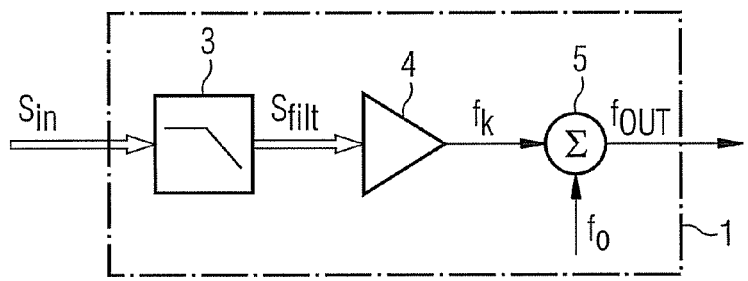
FIG 4
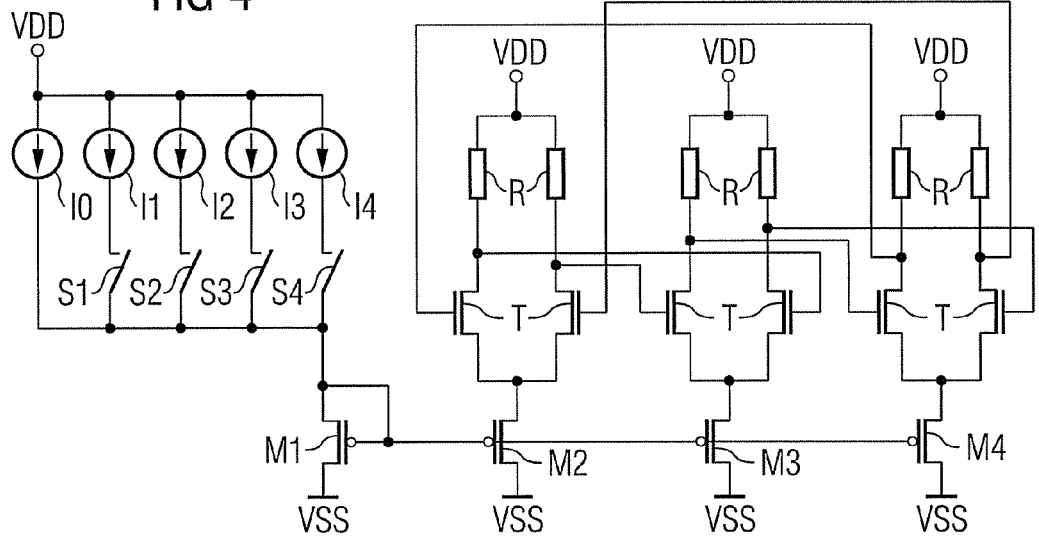

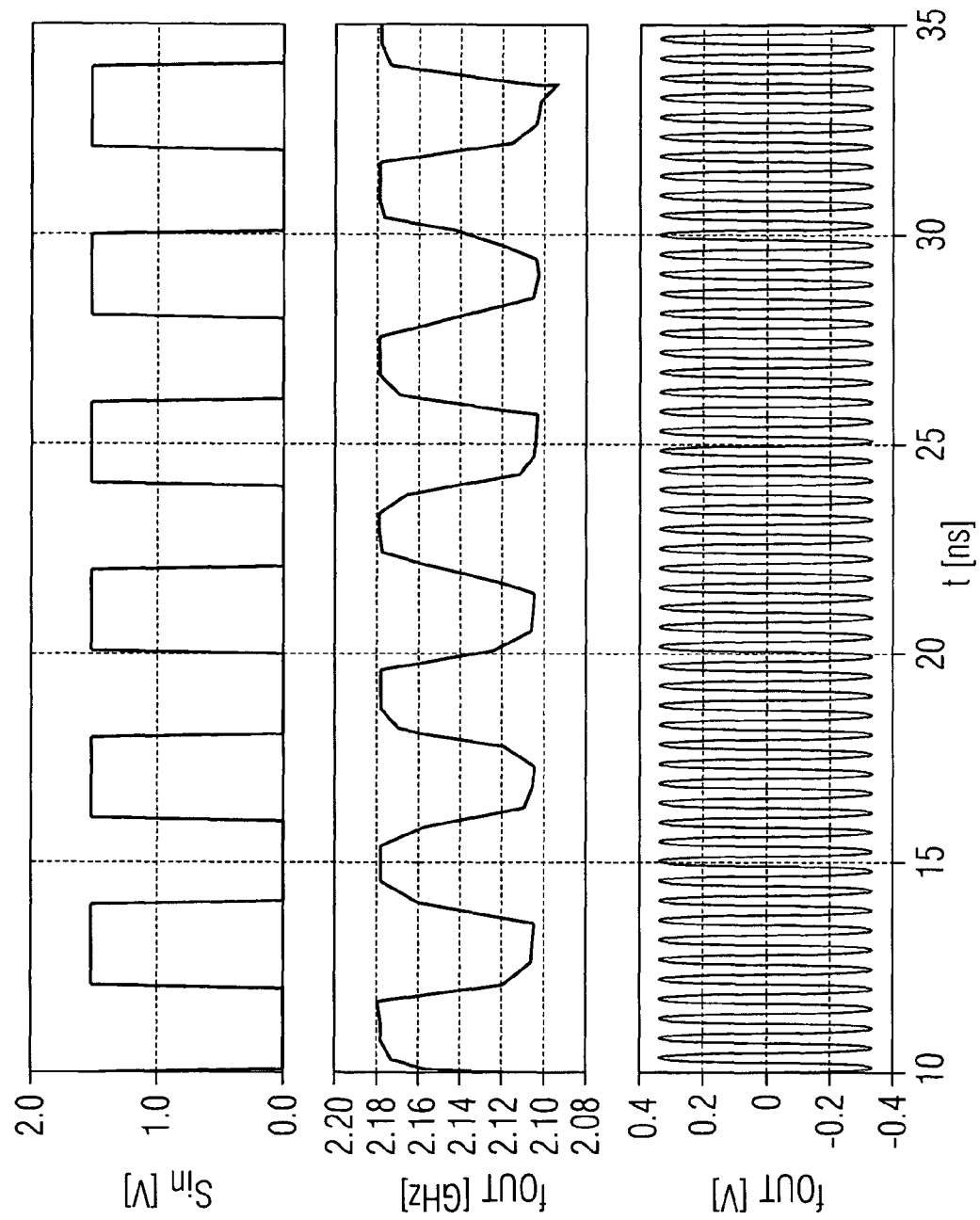

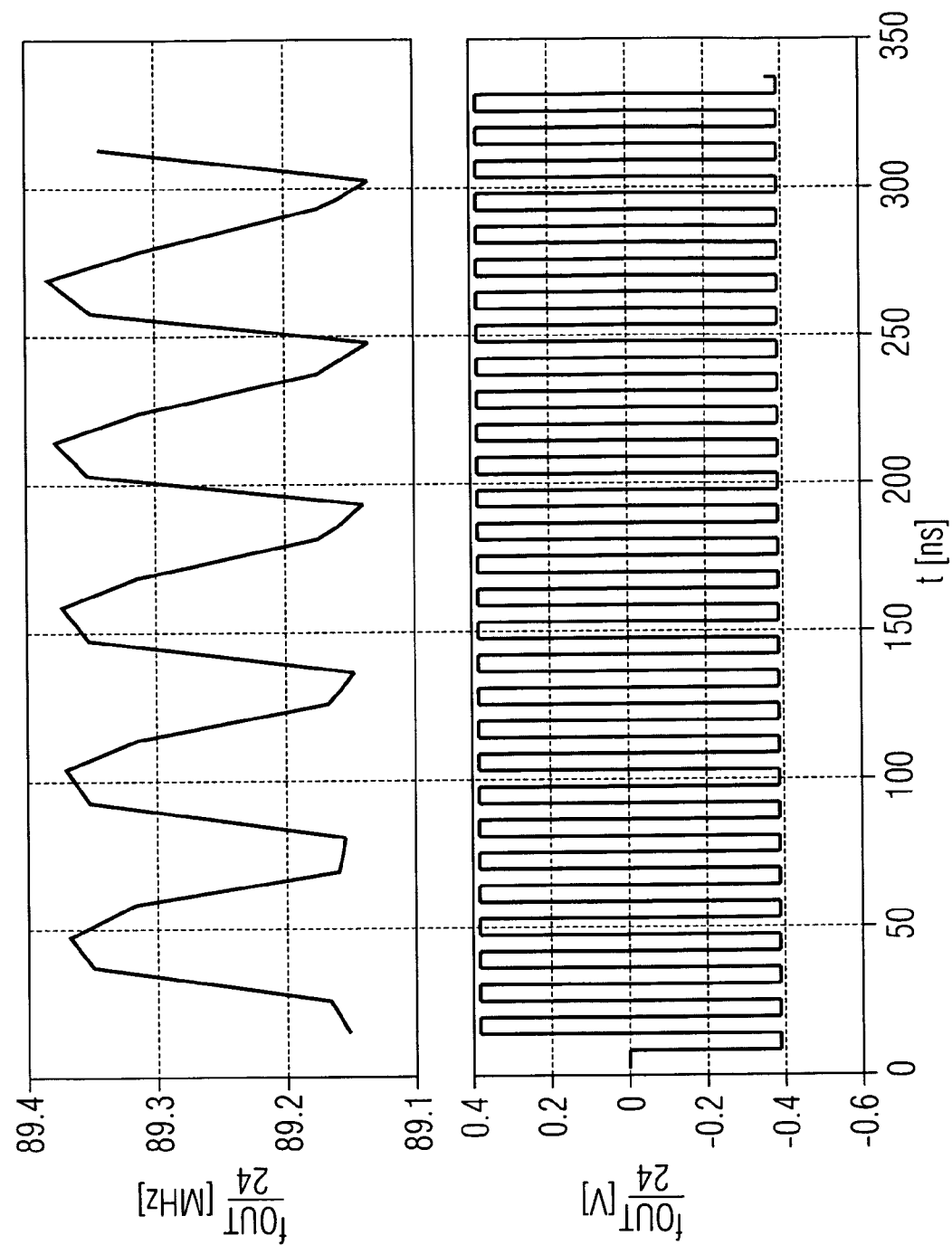

DEVICE AND METHOD FOR FREQUENCY SYNTHESIS

CROSS REFERENCE TO RELATED APPLICATION

This Utility Patent Application claims the benefit of the filing date of German Application No. DE 103 03 405.6, filed Jan. 29, 2003, and International Application No. PCT/EP2004/00677, filed Jan. 27, 2004, both of which are herein incorporated by reference.

FIELD OF THE INVENTION

The present invention relates to a device and a method for frequency synthesis, particularly for frequency synthesis with the use of digitally controlled oscillators.

BACKGROUND

Oscillators capable of generating only certain frequencies are frequently used in semiconductor electronics. An example of such oscillators are digitally controlled oscillators (DCOs). Such a digitally controlled oscillator is represented exemplarily in FIG. 1. In this figure, the digitally controlled oscillator 1 is supplied with a parameter $s_{in}$ which can assume only a finite number of discrete values. The parameter can be any physical quantity, such as current, voltage, capacitance, inductance, resistance and the like. The value that is assumed by this parameter is usually determined by the status (value) of a digital bus. In the following, the various possible values of the digital bus are designated as digital words, and denoted by D1, D2, . . . , DN. The set of all digital words is designated as S(D)={D1, D2, . . . , DN}. An output frequency of the output signal $f_{OUT}$ of the digitally controlled oscillator 1 is uniquely assigned to a specific value of the input parameter $s_{in}$, i.e., to a specific digital word out of the set S(D). It follows from this that the digitally controlled oscillator can generate only a discrete set of output frequencies. In the following, these frequencies are denoted by f1, f2, . . . , fN, and the corresponding set of all possible frequencies is denoted by S(f). It is assumed that the frequency fi is assigned to the digital word Di.

In many applications, it may be the case that a frequency which is not included in the set S(f) is to be generated by the digitally controlled oscillator. An example of this is a closed-loop control circuit, in which the output frequency of the digitally controlled oscillator is to be regulated to a multiple of a certain reference frequency, for example through use of a phase-locked loop (PLL). This reference frequency or its multiples is/are generally independent of the frequencies that can be generated by the digitally controlled oscillator, and therefore generally does not/do not correspond with elements of the set S(f).

Hitherto, this problem has been solved by techniques which usually make extensive use of analog circuits. An example of this is N-frequency-divider synthesis, used for wireless data transmission. In this synthesis, an oscillator, in this case a voltage-controlled oscillator, is driven by analog control signals. The desired output frequency is generated, in that an N-frequency divider is used in the feedback path of the frequency synthesis device. Usually in this case, the module of the N-frequency divider is digitally controlled by a higher-order ($\geq 2$) delta-sigma modulator, in order to reduce disturbing components of the output spectrum of the synthesis device. This solution, however, requires the use of analog circuits, with the typical problems associated with same. An example of this are variations in the gain due to variations in power, voltage or temperature. Moreover, this solution cannot be directly transferred to digital frequency synthesis architectures, in which there is no feedback path.

SUMMARY

The present invention provides a device and a method by a frequency synthesis that is as accurate as possible can be realized with a small amount of resource and, in particular, the use of a digital control is possible.

According to the invention it is proposed that oscillator system that can be driven for the purpose of generating, out of a set of at least two possible output frequencies, an output frequency that can be picked off at an output, be so driven that, for the purpose of generating a desired frequency that is not included in the set of possible output frequencies, the oscillator means alternately generates at least two different output frequencies, out of the set of possible output frequencies, in such a way that the average value of the generated output frequencies over a time period is substantially the desired frequency.

The at least two generated output frequencies are in this case preferably alternated at an average frequency that is greater than the reciprocal value of the time period over which the average value is formed. The oscillator means in this case may comprise a digitally controlled oscillator, or may consist of same. However, it is also conceivable, for example, for the oscillator means to consist of a plurality of individual oscillators which respectively generate only a single frequency.

In this case, the frequency at which the alternation of the at least two output frequencies is performed is substantially dependent on the output frequencies. In particular—in the case of exploitation of averaging effects—it may be selected to be less than the at least two output frequencies or, also, greater than the latter.

The oscillator system, or the digitally controlled oscillator, may in this case comprise, for example, a ring oscillator to which a current, out of a set of possible currents, is supplied for the purpose of driving the oscillator. Alternatively, or additionally, there may be an LC element through which the output frequency can be determined. In this case, the LC element may comprise one or more switchable capacitors, with the result that the total capacitance of the LC element can be varied and the output frequency can thus be controlled. Alternatively, the capacitance of the LC element may include one or more varactor diodes, through the driving of which the total capacitance of the LC element may be varied. In addition, the device may comprise one or more frequency dividers connected to the output of the oscillator means.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated, as they become better understood by reference to the following detailed description. The elements of the drawings are not necessarily to scale relative to each other. Like reference numerals designate corresponding similar parts.

FIG. 1 illustrates the principle of a digitally controlled oscillator.

FIG. 2 illustrates the digitally controlled oscillator from FIG. 1 with a driving means.

FIG. 3 illustrates a linear model of a digitally controlled oscillator.

FIG. 4 illustrates one embodiment of a digitally controlled oscillator.

FIGS. 8a-8c illustrate simulated signal characteristics of the circuit represented in FIG. 7.

BRIEF DESCRIPTION

Figure 5:
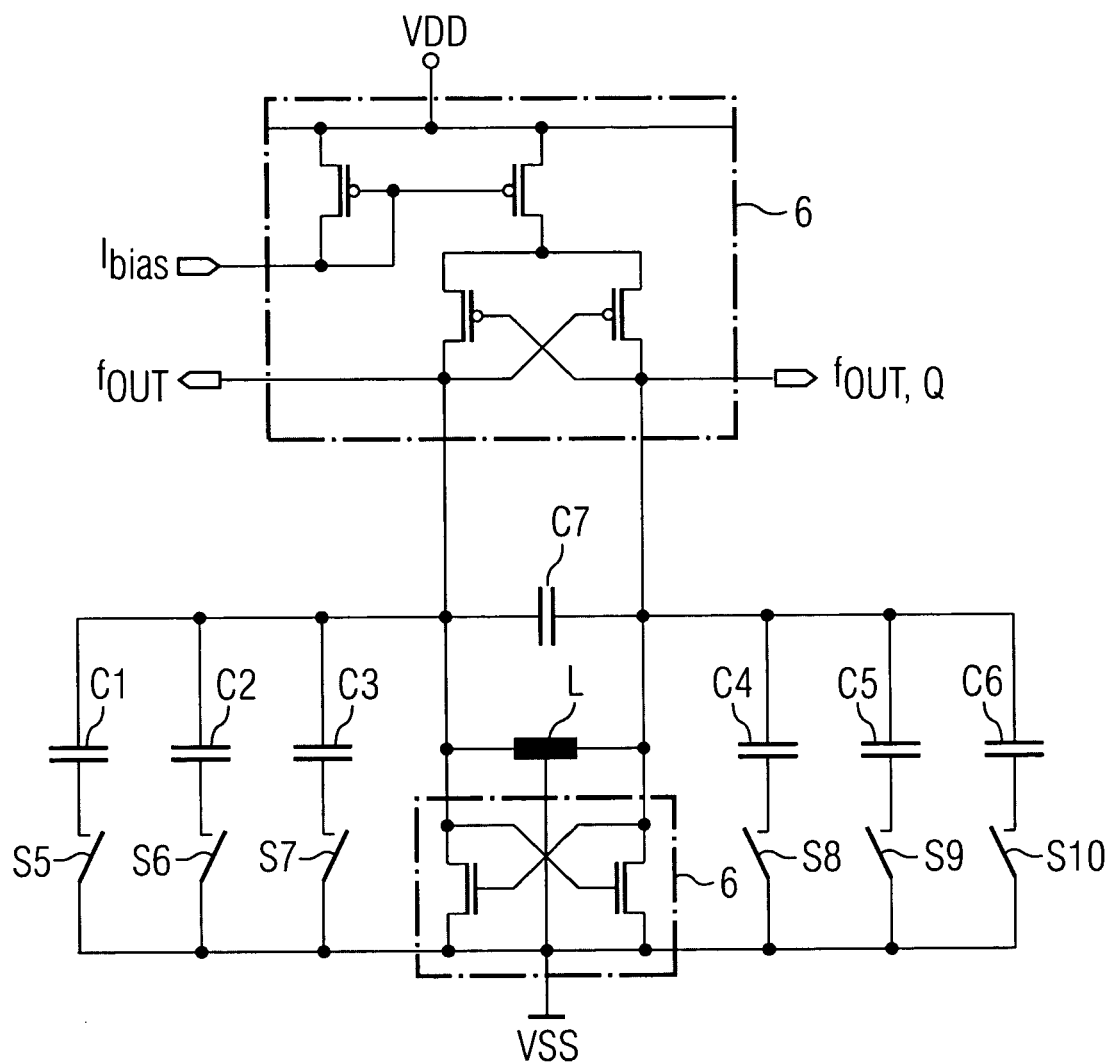
FIG. 5 illustrates a second embodiment of a digitally controlled oscillator.

FIG. 1 illustrates, as explained in detail at the outset, the principle of a digitally controlled oscillator 1.

In FIG. 2, compared with FIG. 1, there is additionally a control device 2 for driving the digitally controlled oscillator 1. The control device may be, for example, a digital processor which drives the digitally controlled oscillator 1 via a digital control bus. A digital control signal $s_{in}$ is sent to the digitally controlled oscillator 1 via the digital control bus. This digital control signal $s_{in}$ can assume values, for example current values, voltage values or resistance values, out of a finite set of possible input signals S(D). In dependence on the control signal $s_{in}$, the digitally controlled oscillator 1 generates an output signal $f_{OUT}$, the frequency of which is in each case uniquely assigned to a certain control signal $s_{in}$ out of the set S(D). From this it is evident that the output frequency likewise originates from a finite set S(f) of possible output frequencies.

If it is then necessary or desired to generate an output signal $f_{OUT}$ at a frequency that is not included in the set S(f), according to the invention the control device 2 drives the digitally controlled oscillator 1 such that the latter generates at least two different frequencies, out of the set S(f), so that the time average of the frequency of the output signal $f_{OUT}$ results in exactly this desired frequency.

The time averaging in this case is effected over a time period $T_{av}$. The value of $T_{av}$ depends on the respective application. The least possible value for $T_{av}$ is one period of the output clock pulse of the digitally controlled oscillator.

A digitally controlled oscillator, controlled by a single-bit bus by which the two values of the control signal $s_{in}$, namely D1=0 and D2=1, can be transmitted, may serve in this case as a simplified example of a device according to the invention. The digitally controlled oscillator can thus be driven to output only two frequencies, namely f1 and f2. If it is then desired to generate a frequency that is exactly between these two frequencies f1 and f2, namely (f1+f2)/2, this can be realized in that the control signal $s_{in}$ alternates with a pulse duty factor of 50% between the values D1 and D2.

In general, a desired frequency can also be generated by averaging over more than two frequencies, in that the control signal $s_{in}$ alternates between the corresponding values out of the set S(D).

In order to obtain a correct output frequency, an average switch-over frequency $f_s$ between the various necessary control signals $s_{in}$ out of the set S(D) must be greater than the inverse of the averaging time period $T_{av}$. How much greater, depends on how rapidly the output signal $f_{OUT}$ of the digitally controlled oscillator reacts to changes of the control signal $s_{in}$.

This lag can be understood by reference to the linear model of a digitally controlled oscillator represented in FIG. 3. In the case of this model, the control signal $s_{in}$ is first supplied to a low-pass filter 3, which produces a filtered control signal $s_{filt}$ from the control signal $s_{in}$. In the linear model, it is taken as a basis that the frequency of the output signal $f_{OUT}$ is to be a linear function of the filtered input signal $s_{filt}$. Accordingly, as represented in simplified form, the linear oscillator multiplies the signal $s_{filt}$ by a constant K, in order to obtain an intermediate signal $f_k$ having an intermediate frequency. In order to obtain the output signal $f_{OUT}$, there is added to the frequency of the intermediate signal $f_k$ a further signal $f_0$, which corresponds to the frequency of the digitally controlled oscillator when the control signal $s_{in}$ is equal to zero.

The lag of the digitally controlled oscillator depends in this case on the cut-off frequency of the low-pass filter. A small cut-off frequency means a long lag, or a large intrinsic averaging effect, of the digitally controlled oscillator.

If the averaging time period $T_{av}$ is only one period of the output clock pulse of the digitally controlled oscillator (no averaging), the value of $s_{in}$ must be changed several times during the time $T_{av}$ ($f_s \gg 1/T_{av}$). In this case, $f_s$ is thus greater than f1 and f2 of the digitally controlled oscillator. If the reaction of the digitally controlled oscillator is sufficiently slow, $f_s$ can be reduced by reason of the intrinsic averaging effect of the digitally controlled oscillator and, in this case—if necessary, with the exploitation of averaging effects of downstream frequency dividers—also become smaller, or substantially smaller, than the frequencies f1 and f2, this permitting simpler driving at high frequencies. If the intrinsic averaging effect of the digitally controlled oscillator is particularly great, it is also possible to use as a control signal $s_{in}$ a bit stream that has been generated according to the delta-sigma principle and, if necessary, noise-shaped. The high-frequency noise produced in this case is removed by the low-pass filter before the output signal $f_{OUT}$ is generated.

Various realization possibilities for the digitally controlled oscillator are to be explained in the following.

FIG. 4 illustrates an exemplary embodiment of a digitally controlled oscillator based on a ring oscillator. In this case, the actual ring oscillator consists of transistors T and resistors R as a chain of series-connected inverters. The frequency of the ring oscillator in this case is determined by the current that flows through the transistors T of the ring oscillator. This current is determined by a current source I0 and by current sources I1-I4 that can be switched by switches S1-S4. The thus determined total current is transferred to the ring oscillator through the current mirror circuit M1-M4. The thus designed oscillator is digitally driven in this case by opening and closing of the switches S1-S4. Closing of the switches S1-S4 causes the respective current I1-I4 to be added to the minimum current I0.

A further possibility is to use an LC oscillatory circuit as a digitally controlled oscillator. In this case, the oscillation frequency is determined by the values of the inductance L and of the total capacitance C. In this case, the value $1/(2\pi \times \sqrt{LC})$ is obtained, in a first approximation, as an output frequency. In this case, the output frequency can be digitally controlled through variation of the total capacitance C. If C can assume only a finite number of discrete values, the output frequency of the digitally controlled oscillator can assume only a discrete number of values.

A first example of this is represented in FIG. 5. In the case of the oscillator represented in FIG. 5, the total capacitance C is formed by the capacitors C1-C7. In this case, the capacitors C1-C6 can be switched by switches S5-S10. The total capacitance can thus be varied through actuation of the switches. The inductance L in this case remains fixed. In addition, there is a driving circuit 6, which is supplied with a fixed current $I_{bias}$. This driving current serves to compensate losses that occur in the oscillatory circuit. The output signal can then be picked off at the terminations denoted by $f_{OUT}$ or $f_{OUT,Q}$.

Figure 6:
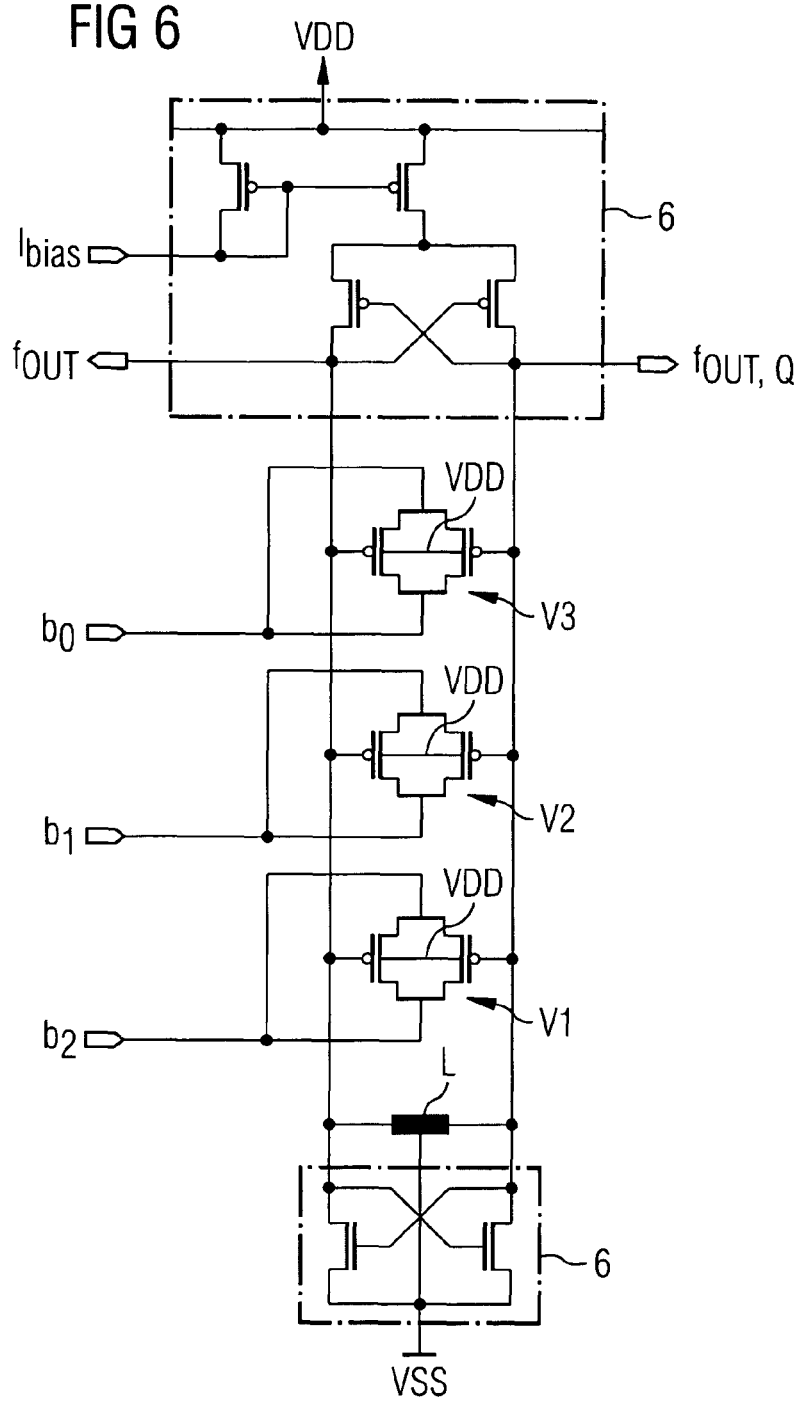
FIG. 6 illustrates a third embodiment of a digitally controlled oscillator.

A similar oscillator is represented in FIG. 6. Instead of the capacitors from FIG. 5, here there are varactor diodes V1-V3, the capacitance of which can be controlled by a voltage applied to the terminations $b_0$-$b_2$. Thus, again, it is possible to adjust the total capacitance and to control the output frequency of the oscillator. In other respects, the structure of the oscillator represented in FIG. 6 is identical to that represented in FIG. 5. The advantage of the circuit represented in FIG. 6 compared with that represented in FIG. 5 is that no switches are required.

Figure 7:
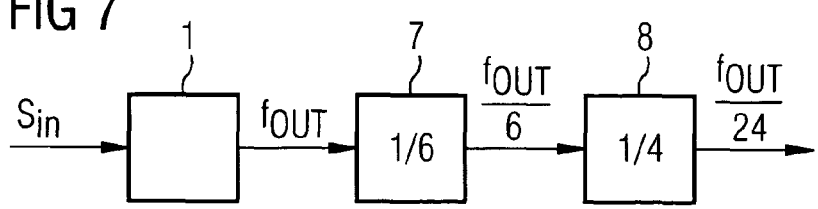
FIG. 7 illustrates a block diagram of a device, according to the invention, for realizing circuit simulations.

A digitally controlled oscillator similar to that represented in FIG. 6 was used to perform simulations. The structure used for simulation is represented schematically in FIG. 7.

A oscillator 1 is used which is based on an LC oscillatory circuit and digitally controlled by a single-bit control signal $s_{in}$. The digitally controlled oscillator can generate only two frequencies: 2.1 GHz and 2.18 GHz. The output frequency is first divided by six by a first frequency divider 7, and then again divided by four by a second frequency divider 8, so that in total the frequency is divided by 24. Accordingly, overall, the two frequencies 87.5 MHz and 90.8 MHz can be generated by means of the arrangement. A frequency of 89.2 MHz, which is exactly between these two frequencies, is then to be generated using this arrangement. This can be achieved in that the control bit is switched over between the two states, with a pulse duty factor of 50%. In the simulation represented in the following, the switch-over time was two nanoseconds. The switch-over frequency $f_s=\frac{1}{2}ns=500$ MHz is thus substantially less than the frequencies that are generated by the digitally controlled oscillator.

Figure 8B:
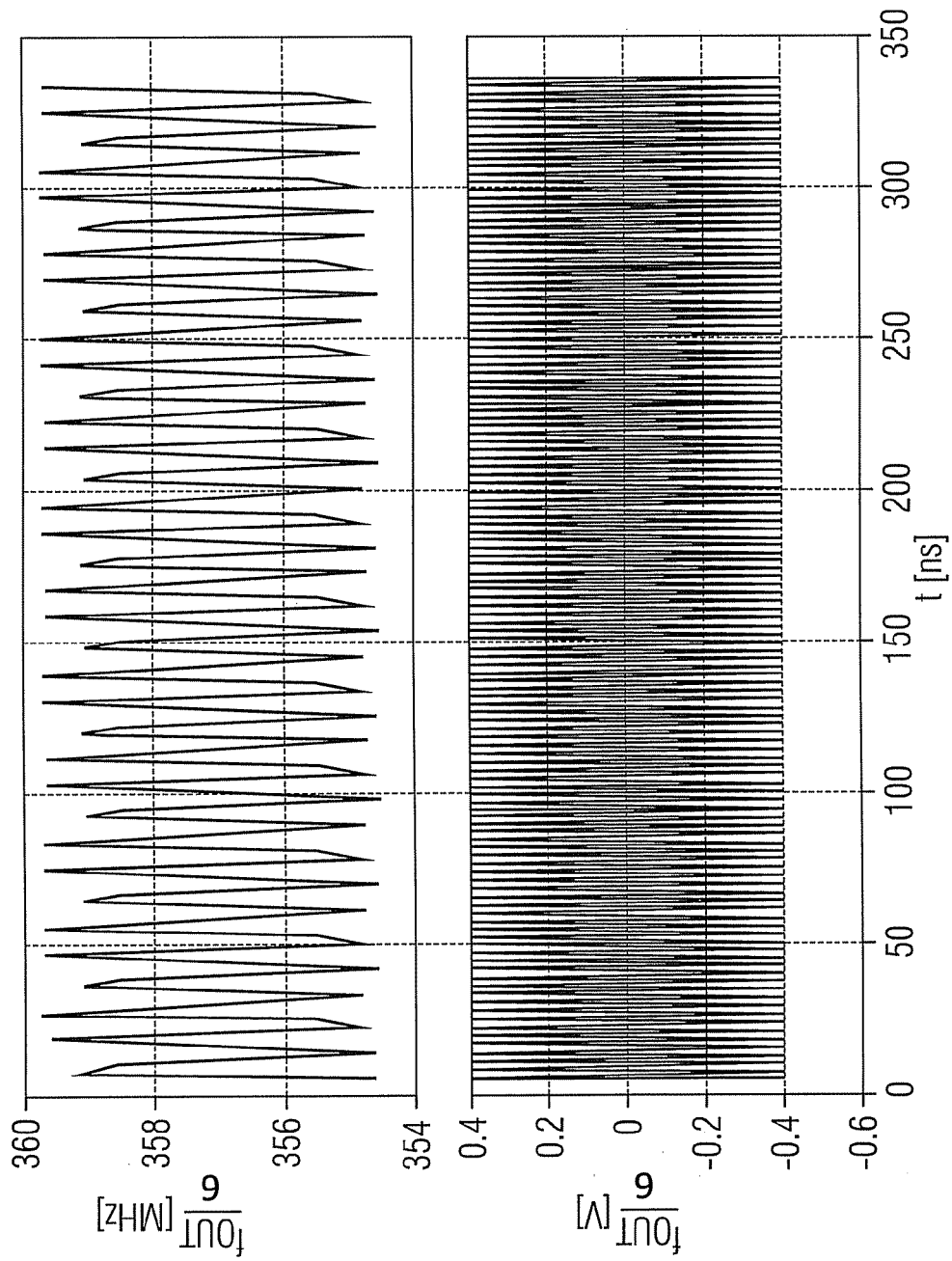

FIG. 8 illustrates the results of the simulation. FIG. 8a illustrates the time characteristic of the voltage of the control signal and the time characteristic of the frequency and of the voltage of the signal four generated by the digitally controlled oscillator. FIGS. 8b and 8c respectively show the time characteristic of the frequency and of the voltage of the signal after the first and the second frequency divider respectively. As shown in FIG. 8c, the output frequency fluctuates by only a small amount around the desired value of 89.2 MHz. The relative frequency error at the output of the digitally controlled oscillator is 3.7%. The frequency dividers cause the averaging period to be extended. At the output of the second frequency divider, the relative frequency error is still only 0.22%. An even smaller frequency error can be achieved through a shorter switch-over time. Exploitation of the averaging effects of the frequency dividers 7, 8, however, enables a good result to be achieved, even with a switch-over time which is long compared with the output frequencies of the digitally controlled oscillator. Obviously, a similar result might also be achieved with an oscillator which—as already described—has a large intrinsic averaging.

It is thus demonstrated that, by means of a device according to the invention and a method according to the invention, it is possible to generate an output frequency which does not directly correspond to a frequency that can be generated by the oscillator used.

I claim:

1. A device for frequency synthesis comprising:
    an oscillator driven for generating, at a frequency out of a set of at least two possible output frequencies, an output signal;
    a control device for driving the oscillator, wherein the control device, for the purpose of generating a desired frequency that is not included in the set of possible output frequencies is configured to drive the oscillator to alternately generate at least two different output frequencies, out of the set of possible output frequencies, such that an average value of the generated output frequencies over a certain time period is the desired frequency plus or minus a relative frequency error, wherein the control device is configured to drive the oscillator such that the at least two generated output frequencies are alternated at a selected average switching frequency that is less than the at least two possible output frequencies; and
    a frequency divider connected to the output of the oscillator and configured to reduce the relative frequency error generated at the selected average switching frequency, wherein the selected average switching frequency is selected to be smaller than a switching frequency necessary to obtain a desired relative frequency error without the frequency divider.

2. The device of claim 1, wherein the control device is configured to drive the oscillator with a bit stream generated according to a delta-sigma-principle.

3. The device of claim 1, wherein the control device is configured to drive the oscillator such that the at least two generated output frequencies are alternated at an average switching frequency that is greater than the reciprocal value of the certain time period.

4. The device of claim 1, wherein the oscillator comprises a digitally controlled oscillator.

5. The device of claim 1, wherein the oscillator comprises a ring oscillator, wherein a current, out of a set of possible currents, can be supplied to the ring oscillator for the purpose of driving the ring oscillator.

6. The device of claim 1, wherein the device is of digital design.

7. A method for frequency synthesis comprising:
    providing an oscillator driven to generate an output signal having an output frequency out of a set of possible output frequencies;
    driving the oscillator for the purpose of generating a desired frequency that is not included in the set of possible output frequencies, in such a way that the oscillator alternately generates at least two different output frequencies, out of the set of possible output frequencies, such that the average value of the at least two generated output frequencies over a certain time period is the desired frequency plus or minus a relative frequency error; and
    alternating the at least two generated output frequencies at a selected average switching frequency that is less than the at least two different output frequencies; and
    dividing, with a frequency divider, the frequency of the output signal generated by the oscillator to reduce the relative frequency error generated at the selected average switching frequency, wherein the selected average switching frequency is selected to be smaller than a switching frequency necessary to obtain a desired relative frequency error without the frequency divider.

8. The method of claim 7, wherein driving the oscillator comprises driving the oscillator with a bit stream generated according to a delta-sigma-principle.

9. The method of claim 7, comprising alternating the at least two generated output frequencies at an average switching frequency that is greater than the reciprocal value of the certain time period.

* * * * *